United States Patent
Li et al.

(10) Patent No.: US 9,872,382 B2
(45) Date of Patent: *Jan. 16, 2018

(54) LOW DIELECTRIC COMPOSITE MATERIAL AND LAMINATE AND PRINTED CIRCUIT BOARD THEREOF

(71) Applicant: Elite Electronic Material (Zhong Shan) Co., Ltd., Zhongshan, Guongdong Province (CN)

(72) Inventors: Changyuan Li, Zhongshan (CN); Chen-Yu Hsieh, Guanyin Township (CN); Hao Chen, Zhongshan (CN); Lianhui Cai, Zhongshan (CN); Xiangnan Li, Zhongshan (CN)

(73) Assignee: Elite Electronic Material (Zhong Shan) Co., Ltd., Zhongshan (CN)

( * ) Notice: Subject to any disclaimer, the term of this patent is extended or adjusted under 35 U.S.C. 154(b) by 47 days.

This patent is subject to a terminal disclaimer.

(21) Appl. No.: 14/793,341

(22) Filed: Jul. 7, 2015

(65) Prior Publication Data
US 2016/0021739 A1    Jan. 21, 2016

(30) Foreign Application Priority Data
Jul. 10, 2014   (CN) .......................... 2014 1 0328196

(51) Int. Cl.
| | | |
|---|---|---|
| *B32B 15/08* | (2006.01) | |
| *B32B 15/20* | (2006.01) | |
| *B32B 27/04* | (2006.01) | |
| *B32B 27/18* | (2006.01) | |
| *C08K 5/5397* | (2006.01) | |
| *C09D 4/00* | (2006.01) | |
| *C09D 171/12* | (2006.01) | |
| *H05K 1/03* | (2006.01) | |
| *C08K 5/5313* | (2006.01) | |
| *C08K 5/54* | (2006.01) | |
| *C09D 133/14* | (2006.01) | |
| *B32B 5/02* | (2006.01) | |

(Continued)

(52) U.S. Cl.
CPC ........... *H05K 1/0373* (2013.01); *B32B 5/022* (2013.01); *B32B 5/024* (2013.01); *B32B 15/046* (2013.01); *B32B 15/08* (2013.01); *B32B 15/14* (2013.01); *B32B 27/281* (2013.01); *B32B 27/36* (2013.01); *C03C 25/32* (2013.01); *C08K 5/5313* (2013.01); *C08K 5/5397* (2013.01); *C08K 5/5406* (2013.01); *C09D 4/00* (2013.01); *C09D 133/14* (2013.01); *B32B 15/20* (2013.01); *B32B 2255/02* (2013.01); *B32B 2255/06* (2013.01); *B32B 2255/10* (2013.01); *B32B 2255/26* (2013.01); *B32B 2260/021* (2013.01); *B32B 2260/046* (2013.01); *B32B 2262/101* (2013.01); *B32B 2307/20* (2013.01); *B32B 2307/30* (2013.01); *B32B 2307/3065* (2013.01); *B32B 2307/50* (2013.01); *B32B 2457/08* (2013.01); *C09D 171/12* (2013.01); *H05K 1/024* (2013.01); *H05K 1/0326* (2013.01); *H05K 3/4688* (2013.01); *H05K 2201/012* (2013.01); *H05K 2201/0195* (2013.01)

(58) Field of Classification Search
CPC ................................................... C08K 5/5397
USPC ......................................................... 524/129
See application file for complete search history.

(56) References Cited

U.S. PATENT DOCUMENTS

| | | | | |
|---|---|---|---|---|
| 9,469,757 | B2 * | 10/2016 | Wang .................... | C08K 5/5397 |
| 2005/0042466 | A1 * | 2/2005 | Ohno .................... | C08G 65/485 |
| | | | | 428/457 |
| 2010/0292376 | A1 * | 11/2010 | Timberlake .......... | C08K 5/5397 |
| | | | | 524/129 |

FOREIGN PATENT DOCUMENTS

JP    2011068713 A   *   4/2011

OTHER PUBLICATIONS

Machine translation of JP 2011-068713A, Apr. 2011.*

* cited by examiner

*Primary Examiner* — Ramsey Zacharia
(74) *Attorney, Agent, or Firm* — Hoffmann & Baron, LLP

(57) ABSTRACT

The present invention belongs to the technical field of resin composite materials, in particular relates to a low dielectric composite material and a laminate and printed circuit board prepared therefrom. The composite material is obtained by adhering a low dielectric resin composition with phosphorus-containing flame retardant onto a substrate; the composition comprises the following components: (A) phosphorus-containing flame retardant; (B) vinyl compound. The phosphorus-containing flame retardant has a structure as shown in formula (I).

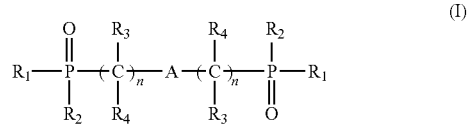

In the present invention, diphenylphosphine oxide is derivatized, and prepared a phosphorus-containing flame retardant, which has no reactive functional groups, has better dielectric properties, and has high melting point, and upon combining with a vinyl compound, a resin composition is obtained, and a composite material having low thermal expansion ratio, high heat resistance, high glass transition temperature, and low dielectric constant and dissipation factor, can be made from the resin composition, and a laminate and printed circuit board having the properties of high glass transition (Continued)

temperature, low dielectric properties, halogen-free flame retardancy, low thermal expansion coefficient of the laminate, etc., can be made from the composite material.

11 Claims, 2 Drawing Sheets

(51) Int. Cl.
*B32B 15/04* (2006.01)
*B32B 15/14* (2006.01)
*B32B 27/28* (2006.01)
*B32B 27/36* (2006.01)
*C03C 25/32* (2006.01)
*H05K 1/02* (2006.01)
*H05K 3/46* (2006.01)

LOW DIELECTRIC COMPOSITE MATERIAL AND LAMINATE AND PRINTED CIRCUIT BOARD THEREOF

TECHNICAL FIELD

The present invention belongs to the technical field of resin composite materials, particularly relates to a low dielectric composite material and a laminate and printed circuit board prepared therefrom.

BACKGROUND ART

Low dielectric resin materials are currently the main direction for developing a laminate with a high transmission rate, wherein the low dissipation factor (also called dielectric loss tangent) and the low dielectric constant are the main indexes for evaluating the low dielectric resin materials, however, the currently available low dielectric resin materials have the defects of environmentally unfriendly effects caused by using the halogen-containing flame retardants, poor flame retardancy caused by using the general phosphorus-containing flame retardants, poor heat resistances of the laminates, high thermal expansion ratios of the laminates, etc.

SUMMARY OF THE INVENTION

In order to overcome the shortcomings of environmentally unfriendly effects caused by using the halogen-containing flame retardants and the defects of poor flame retardancy caused by using the currently available phosphorus-containing flame retardants in the prior art described above, the primary object of the present invention is to provide a low dielectric composite material. The composite material has the properties of high glass transition temperature, low dielectric properties, halogen-free flame retardancy, low thermal expansion ratio of the laminate, etc.

Another object of the present invention is to provide a method for preparing the abovementioned low dielectric composite material.

A further object of the present invention is to provide a laminate and printed circuit board made from the abovementioned low dielectric composite material.

The objects of the present invention can be achieved by the following technical solutions:

a low dielectric composite material is obtained by adhering a low dielectric resin composition with phosphorus-containing flame retardant onto a substrate;

the low dielectric resin composition with phosphorus-containing flame retardant, comprises the following components:

(A) phosphorus-containing flame retardant;
(B) vinyl compound;

the phosphorus-containing flame retardant described in the present invention has a structure as shown in formula (I):

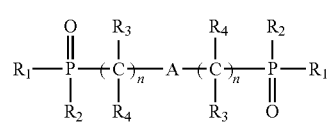

wherein, A is a covalent bond, C6~C12 arylene, C3~C12 cycloalkylene, C6~C12 cycloalkenylene, methylene or C2~C12 alkylene;

$R_1$ and $R_2$ are the same or different, and are each a H, alkoxy, aryloxy, alkyl, aryl, or silyl, respectively;

$R_3$ and $R_4$ are the same or different, and are each a H, hydroxyl, or C1~C6 alkyl, respectively, or one and only one of $R_3$ and $R_4$ forms a carbonyl with a C;

each of n is independently a positive integer of 1~6.

However, among them, there are no particular limitations to the abovementioned substrate, any of the materials, which have the supporting and reinforcing effects, can be used. The substrate is preferably one of fiber material, woven, non-woven, PET film (polyester film), PI film (polyimide film), copper foil, and resin coated copper (RCC), such as glass fiber cloth, etc., which can increase the mechanical strength of the composite material. Furthermore, the substrate can be selectively pretreated with a silane coupling agent, without affecting the performances of the low dielectric composite material of the present invention. The composite material has the properties of high glass transition temperature, low dielectric properties, halogen-free flame retardancy, low thermal expansion ratio of the laminate, etc.

The phosphorus-containing flame retardant with the present invention preferably has at least one of the structures as shown in the following formulae (II)~(XV):

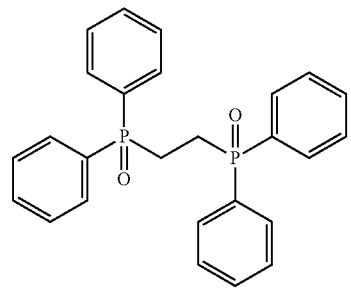

(II)

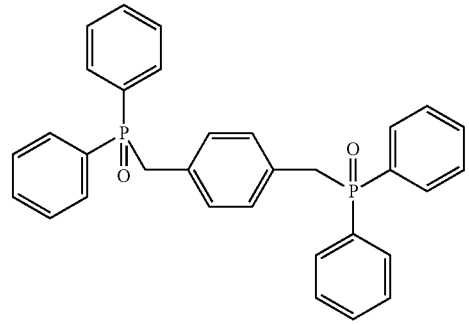

(III)

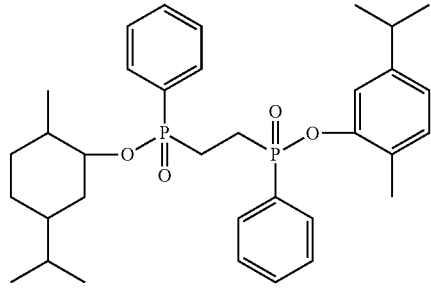

(IV)

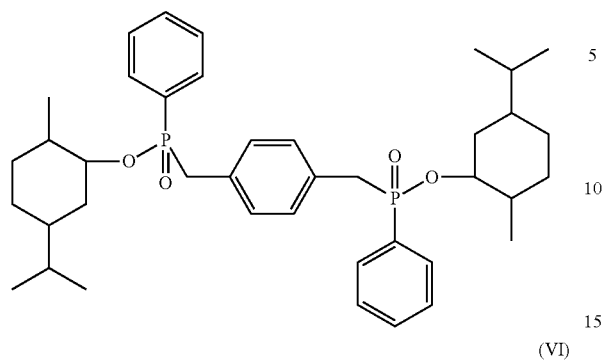
(V)
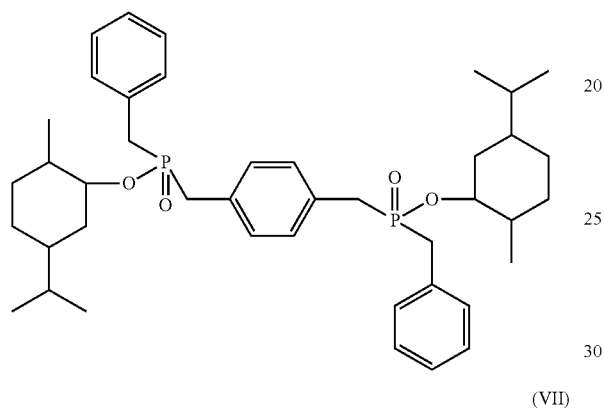
(VI)
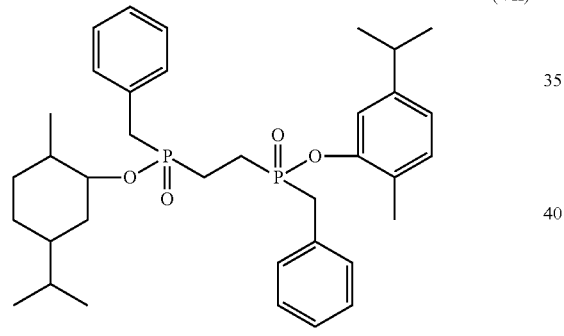
(VII)
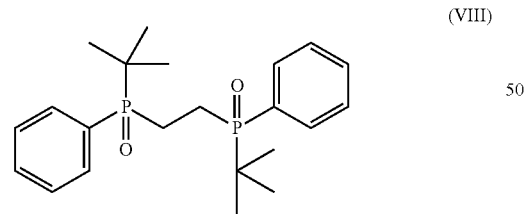
(VIII)
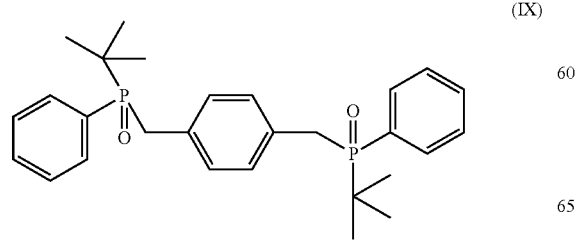
(IX)
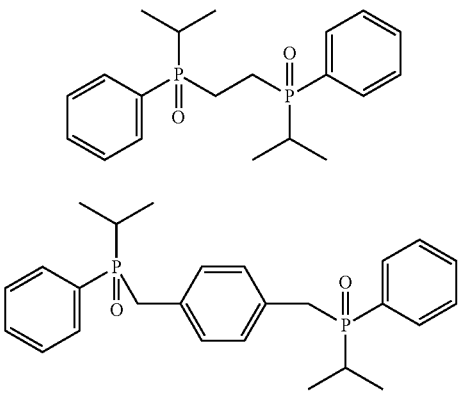
(X)
(XI)
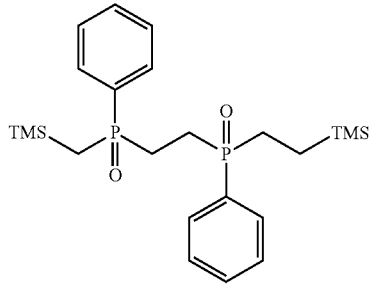
(XII)
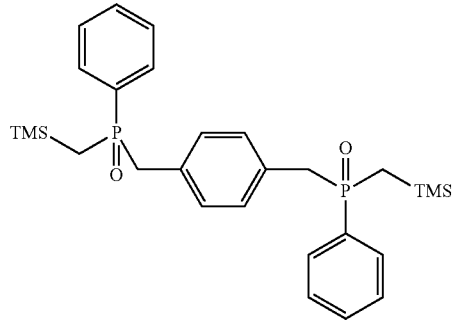
(XIII)
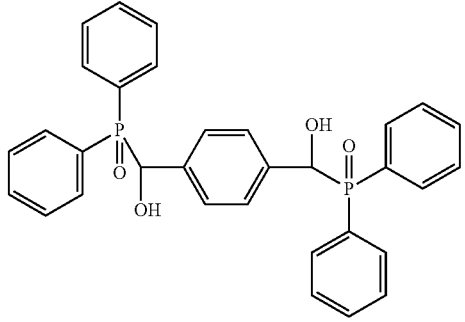
(XIV)

-continued

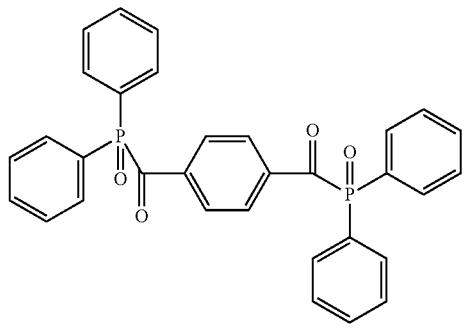
(XV)

wherein, TMS represents trimethylsilyl.

The phosphorus-containing flame retardant of the present invention has a high melting temperature, more than 300° C.

The vinyl compound can be at least one of vinyl polyphenylene ether resin, vinylbenzyl compound resin, polyolefin compound and maleimide resins.

The vinylbenzyl compound resin is a polymer or prepolymer containing a vinylbenzyl structure, such as DP-85T (vinylbenzyl etherified-dicyclopentadiene-phenol resin) from Chin Yee Chemical Industries Ltd.

The vinyl polyphenylene ether resin refers to a polyphenylene ether resin with the end capping group having an unsaturated double bond (vinyl-terminated polyphenylene ether resin).

Preferably, the vinylpolyphenylene ether resin refers to a polyphenylene ether resin having one of the following structures of the formulae (XVI) and (XVII), but not limited thereto:

Formula (XVI)

[Structure with $R_5, R_6, R_7, R_8, R_9, R_{10}, R_{11}$ and $Z—[O—Y]_a—[O—X—O]—[Y—O]_b—Z$]

Formula (XVII)

[Structure with repeating units $m$ and $n$, containing G group]

wherein, —(O—X—O)— refers to

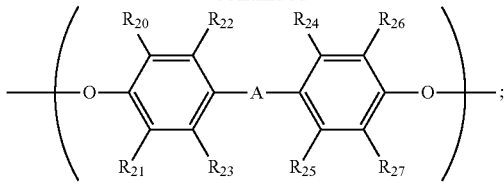

or

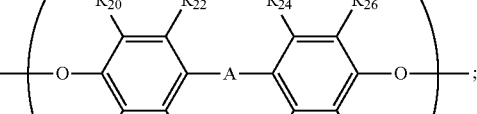

—(Y—O)— refers to

[Structure with $R_{28}, R_{29}, R_{30}, R_{31}$]

$R_5$ and $R_6$ are each a hydrogen atom, $R_7, R_8, R_9, R_{10}$ and $R_{11}$ are the same or different, and are each a hydrogen atom, halogen atom, alkyl, or halogen-substituted alkyl respectively;

$R_{12}, R_{13}, R_{18}$ and $R_{19}$ are the same or different, and are each a halogen atom, C1~C6 alkyl or phenyl respectively;

$R_{14}, R_{15}, R_{16}$ and $R_{17}$ are the same or different, and are each a hydrogen atom, halogen atom, C1~C6 alkyl or phenyl respectively;

$R_{20}, R_{21}, R_{22}, R_{23}, R_{24}, R_{25}, R_{26}$ and $R_{27}$ are the same or different, and are each a halogen atom, C1~C6 alkyl, phenyl or hydrogen atom; A is a C1~C20 linear, branched, or cyclic alkylene, preferably —CH$_2$— or —C(CH$_3$)$_2$—;

$R_{28}$ and $R_{29}$ are the same or different, and are each a halogen atom, C1-C6 alkyl or phenyl; $R_{30}$ and $R_{31}$ are the same or different, and are each a hydrogen atom, halogen atom, C1~C6 alkyl or phenyl;

Z represents an organic group having at least one carbon atom, which group can comprise an oxygen atom, nitrogen atom, sulfur atom and/or halogen atom, for example Z can be a methylene (—CH$_2$—);

a and b are each a natural number of 1~30, respectively;

wherein, G is a bisphenol A, bisphenol F or covalent bond; m and n are each a natural number of 1~15, respectively.

The vinylbenzyl ether polyphenylene ether resin refers to a polyphenylene ether resin having a structure of

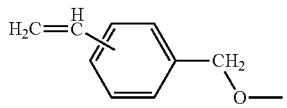

More preferably, the vinyl polyphenylene ether resin refers to at least one of methacrylic polyphenylene ether resin (such as the product SA-9000 from Sabic Company), vinylbenzyl ether polyphenylene ether resin (such as the product OPE-2st from Mitsubishi Gas Chemical Company) and modified vinyl polyphenylene ether resin (such as PPE/VBE 7205L from Chin Yee Chemical Industries Ltd.).

The vinyl polyphenylene ether resin of the present invention has lower dielectric properties, i.e., lower dielectric constant and dissipation factor, as compared to the polyphenylene ether resin with a difunctional terminal hydroxyl.

The polyolefin compound can be at least one of styrene-butadiene-divinylbenzene copolymer, hydrogenated styrene-butadiene-divinylbenzene copolymer, styrene-butadiene-maleic anhydride copolymer, polybutadiene-urethane-methyl methacrylate copolymer, styrene-butadiene copolymer, polybutadiene homopolymer, styrene-isoprene-styrene copolymer, maleinized styrene-butadiene copolymer, methylstyrene copolymer, petroleum resin and cyclic olefin copolymer.

There are no particular limitations to the maleimide resin, all of the well-known maleimide resins can be used, the maleimide resin is preferably at least one of the following substances: 4,4'-bismaleimidodiphenyl methane, phenylmethane maleimide oligomer, N,N'-m-phenylene bismaleimide, bisphenol A diphenyl ether bismaleimide, 3,3'-dimethyl-5,5'-diethyl-4,4'-diphenylmethane bismaleimide, N,N'-(4-methyl-1,3-phenylene)bismaleimide, 1,6-bismaleimido-(2,2,4-trimethyl)hexane, 2,3-dimethylphenylmaleimide (N-2,3-xylylmaleimide), 2,6-dimethylphenylmaleimide (N-2,6-xylenemaleimide), N-phenylmaleimide and the prepolymer of the abovementioned compound, such as a prepolymer of a diallyl compound and a maleimide compound.

The low dielectric resin composition with phosphorus-containing flame retardant of the present invention is prepared by mixing the phosphorus-containing flame retardant and the vinyl compound.

The phosphorus content in the low dielectric resin composition with phosphorus-containing flame retardant of the present invention can be adjusted by changing the amount of the phosphorus-containing flame retardant; wherein, the effective flame resistance effect can be achieved, when the phosphorus content in the low dielectric resin composition of the present invention reaches 2 wt %, preferably 2~3.5 wt %.

The low dielectric resin composition with phosphorus-containing flame retardant of the present invention has high glass transition temperature, low dielectric constant, low dissipation factor, and halogen-free flame retardancy, and the laminate prepared therefrom has good properties of low thermal expansion ratio of the laminate, etc.

In order to achieve the above objects, the low dielectric resin composition with phosphorus-containing flame retardant of the present invention preferably comprises the following components: (A) phosphorus-containing flame retardant; (B) vinyl polyphenylene ether resin; (C) at least one of styrene-butadiene-divinylbenzene copolymer, styrene-butadiene-maleic anhydride copolymer, and polybutadiene-urethane-methyl methacrylate copolymer; and (D) maleimide resin.

More preferably, the following components are comprised, in parts by weight: (A) 10~90 parts of phosphorus-containing flame retardant; (B) 100 parts of vinyl polyphenylene ether resin; (C) 10~90 parts of at least one of styrene-butadiene-divinylbenzene copolymer, styrene-butadiene-maleic anhydride copolymer, and polybutadiene-urethane-methyl methacrylate copolymer; and (D) 10~90 parts of maleimide resin.

Without affecting the effects of the low dielectric resin composition with phosphorus-containing flame retardant of the present invention, at least one of the following additives can further comprise: curing accelerator, solvent, crosslinking agent, silane coupling agent, and inorganic filler.

Without affecting the effects of the low dielectric resin composition with phosphorus-containing flame retardant of the present invention, one or more curing accelerators can be selectively added to promote the curing rate of the resin. Any of the curing accelerators, which can increase the curing rate of the low dielectric resin composition with phosphorus-containing flame retardant of the present invention, can be used. Preferably, the curing accelerator is a curing accelerator comprising a free radical-generating peroxide, including but not limited to: dicumyl peroxide, tert-butyl peroxybenzoate and di(tert-butylperoxyisopropyl)benzene.

More preferably the curing accelerator is di(tert-butylperoxyisopropyl)benzene.

The silane coupling agent can be at least one of the silane compounds and the siloxane compounds.

Preferably, the silane coupling agent is at least one of amino silane compound, amino siloxane compound, styryl silane compound, styryl siloxane compound, acrylic silane compound, acrylic siloxane compound, methylacrylic silane compound, methylacrylic siloxane compound, alkyl silane compound and alkyl siloxane compound.

The solvent can be at least one of methanol, ethanol, ethylene glycol monomethyl ether, acetone, butanone, methylisobutyl ketone, cyclohexanone, toluene, xylene, methoxyethyl acetate, ethoxyethyl acetate, propoxyethyl acetate, ethyl acetate, dimethyl formamide, propylene glycol methyl ether, γ-butyrolactone (GBL) and diisobutyl ketone (DIBK).

The main role of the addition of the inorganic filler is to increase the thermal conductivity of the resin composition, improve the properties of thermal expansivity, mechanical strength, etc., and preferably, the inorganic filler is uniformly distributed in the resin composition.

Preferably, the inorganic filler can comprise at least one of silicon dioxide (spherical, fused, non-fused, porous, or hollow type), aluminum oxide, aluminum hydroxide, magnesium oxide, magnesium hydroxide, calcium carbonate, aluminum nitride, boron nitride, aluminum silicon carbide, silicon carbide, sodium carbonate, titanium dioxide, zinc oxide, zirconium oxide, quartz, diamond powder, diamond-like powder, graphite, magnesium carbonate, potassium titanate, ceramic fiber, mica, boehmite, zinc molybdate, ammonium molybdate, zinc borate, calcium phosphate, calcined talc, talc, silicon nitride, mullite, calcined kaolin clay, clay, basic magnesium sulfate whisker, mullite whisker, barium sulfate, magnesium hydroxide whisker, magnesium oxide whisker, calcium oxide whisker, carbon nanotube, nano-size silicon dioxide and inorganic powder related therewith, and powder particle with the outer shell of the organic core modified with an insulator. And the inorganic filler can be in a spherical, fibrous, plate, granular, flake or needle whisker form.

The method for preparing the low dielectric composite material of the present invention, particularly comprises the following steps:

the low dielectric resin composition with phosphorus-containing flame retardant is dissolved in a solvent, and made into a resin varnish, then adhered onto the substrate in an impregnation or coating means, and formed into a semi-cured state through heating at a high temperature, thus obtaining a low dielectric composite material.

The abovementioned composite material can be cured and formed a cured sheet or cured insulating layer through heating at a high temperature or heating at a high temperature and under a high pressure, wherein if the resin composition contains a solvent, the solvent will be removed via volatilization during heating at a high temperature.

In the above preparation method, the solvent can be at least one of methanol, ethanol, ethylene glycol monomethyl ether, acetone, butanone, methylisobutyl ketone, cyclohexanone, toluene, xylene, methoxyethyl acetate, ethoxyethyl acetate, propoxyethyl acetate, ethyl acetate, dimethyl formamide, propylene glycol methyl ether, γ-butyrolactone and diisobutyl ketone.

In the above preparation method, depending on the requirements of the production process, the solid content of the resin varnish can be freely adjusted, preferably, 45~70 wt %. The heating at a high temperature refers to heating to volatilize the solvent at a temperature, which can be freely adjusted depending on the solvent species, preferably 100~170° C. There are no specific limitations to the thickness of the low dielectric composite material of the present invention, which can be adjusted depending on the practical requirements, preferably 30~75 μm, more preferably 38~50 μm.

Depending on the different substrates used, the different products, such as prepreg, resin film, resin coated copper, flexible resin coated copper, etc., can be obtained from the low dielectric composite material of the present invention.

The resin varnish of the low dielectric resin composition with phosphorus-containing flame retardant is impregnated onto the fiber material, woven or non-woven, and formed into a semi-cured state through heating at a high temperature, thus obtaining a prepreg.

Alternatively, the resin varnish of the low dielectric resin composition with phosphorus-containing flame retardant is coated onto the PET film or PI film, and formed into a semi-cured state through heating at a high temperature, thus obtaining a resin film.

Alternatively, the resin varnish of the low dielectric resin composition with phosphorus-containing flame retardant is coated onto the copper foil or the PI film of the PI film coated copper, and formed into a semi-cured state through heating at a high temperature, thus obtaining a resin coated copper; the abovementioned resin coated copper obtained by coating onto the PI film of the PI film coated copper also called as flexible resin coated copper.

Namely, the resin varnish of the low dielectric resin composition with phosphorus-containing flame retardant is coated onto the PI film of the PI film coated copper, and obtained a flexible resin coated copper through heating at a high temperature.

A laminate is obtained from the abovementioned low dielectric composite material. The laminate is obtained by superimposing and laminating the low dielectric composite material of the present invention described above and a metal foil. The metal foil may be any of the common metals in the art, such as copper foil. The prepared copper clad laminate has the properties of high glass transition temperature, low dielectric properties, halogen-free flame retardancy, low thermal expansion ratio of the laminate, etc., and is particularly suitable for a high speed and high frequency signal transmission printed circuit board. The laminate comprises two or more layers of metal foil and at least one layer of the composite material interposed therebetween. Among them, the metal foil, such as copper foil, can further comprise a metal alloy of at least one of aluminum, nickel, platinum, silver, gold, etc.; the laminate is formed by superimposing the abovementioned composite material between the two layers of the metal foil and laminating at a high temperature and under a high pressure.

The laminating process conditions can be the common laminating process conditions in the art.

A printed circuit board is obtained from on the abovementioned laminate.

The laminate of the present invention described above is carried out a further manufacturing process, such as manufacturing circuit, etc., then a printed circuit board can be obtained. The printed circuit board is engaged with the electric components, then operated in a harsh environment, such as at a high temperature, under a high humidity, etc., without affecting its quality. The printed circuit board prepared from the abovementioned present invention has the properties of high glass transition temperature, low dielectric properties, halogen-free flame retardancy, low thermal expansion ratio of the laminate, etc., and is suitable for high speed and high frequency signal transmission. Among them, the printed circuit board comprises at least one of the abovementioned laminates, and the circuit board can be made from the well-known processes in the art.

The mechanism of the present invention is:

In the present invention, the diphenylphosphine oxide is derivatized, and prepared a phosphorus-containing flame retardant, which has no reactive functional groups, and has better dielectric properties, as compared to the general phosphorus-containing resin, which has excessively high dielectric properties due to having polar groups, for example the phosphorus-containing phenolic resin currently widely used in the art, such as DOPO-bisphenol A phenolic novolac resin (DOPO-BPAN) (XZ92741 from DOW chemical), having a hydroxyl group, which is a polar functional group and can cause the excessively high dielectric properties; and the melting point of the phosphorus-containing flame retardant of the present invention is high (more than 300° C.), which is much higher than those of the low melting point nonreactive phosphorus-containing flame retardants currently widely used in the art, such as phosphazene compound (SPB-100 from Otsuka Chemical Co., Ltd., with a melting point of about 110° C.) and phosphate compounds (PX-200 from Daihachi Chemical Industry Co., Ltd., with a melting point of about 105° C.), and when the phosphorus-containing flame retardant of the present invention is used in combination with the vinyl compound, composite material, laminate and printed circuit board having low thermal expansion ratio, high heat resistance, high glass transition temperature and low dielectric constant and dissipation factor, can be prepared.

As compared to the prior art, the present invention has the following advantages and beneficial effects:

(1) the phosphorus-containing flame retardant in the low dielectric resin composition components with phosphorus-containing flame retardant of the present invention, does not contain the reactive functional groups, and does not react in the reaction, thus having better dielectric properties.

(2) the phosphorus-containing flame retardant of the present invention has a high melting point (more than 300° C.), when it is used in combination with the vinyl compound, a prepreg, resin film, laminate and circuit board having low thermal expansion ratio, high heat resistance, high glass transition temperature, and low dielectric constant and dissipation factor, can be prepared.

(3) the low dielectric resin composition with phosphorus-containing flame retardant of the present invention, can effectively achieve the flame resistance effect of UL94 V-0, without using the halogen-containing flame retardant.

DESCRIPTION OF EMBODIMENTS

Hereinafter the present invention is further described in detail in combination with the examples and the accompanying drawings, but the embodiments of the present invention are not limited thereto.

The chemical names used in the following examples are as follows:

DPPO: diphenylphosphine oxide, purchased from Eumate International Corp.

SA-9000: methyl acrylate-terminated bisphenol A polyphenylene ether resin, purchased from Sabic Company.

OPE-2st: vinylbenzyl ether-terminated diphenyl polyphenylene ether resin, purchased from Mitsubishi Gas Chemical Company.

Ricon184Ma6: styrene-butadiene-maleic anhydride copolymer, purchased from Cray Valley Company.

Ricon257: styrene-butadiene-divinylbenzene copolymer, purchased from Cray Valley Company.

Homide108: phenylmethane maleimide, purchased from Hos-Technik Company.

SPB-100: phosphazene compound, purchased from Otsuka Chemical Co., Ltd.

PX-200: resorcinol bis[di(2,6-dimethylphenyl)phosphate], purchased from Daihachi Chemical Industry Co., Ltd.

XZ92741: DOPO-bisphenol A phenolic novolac resin, purchased from Dow chemical.

DCP: dicumyl peroxide, purchased from Eumate International Corp.

R-45vt: polybutadiene-urethane-methyl methacrylate, purchased from Cray Valley Company.

SQ-5500: spherical silicon dioxide treated with alkyl siloxane compound, purchased from Admatechs Company.

DP-85T: vinylbenzyl etherified-dicyclopentadiene-phenol resin, purchased from Chin Yee Chemical Industries Ltd.

PPE/VBE 7205L: modified vinyl polyphenylene ether resin, purchased from Chin Yee Chemical Industries Ltd.

Example 1: Preparation of Phosphorus-Containing Flame Retardant of Formula (III)

206 g of DPPO (Diphenylphosphine Oxide), 90 g of dichloro-p-xylene, and 1200 g of 1,2-dichlorobenzene were stirred and mixed, then heated and reacted for 12 to 24 hours at 160° C. under nitrogen atmosphere, cooled down to the ambient temperature and filtrated, dried in vacuum, thus obtaining Compound A as shown in formula (III), as a white powder, with the phosphorus content in Compound A of about 12%.

Figure 1:
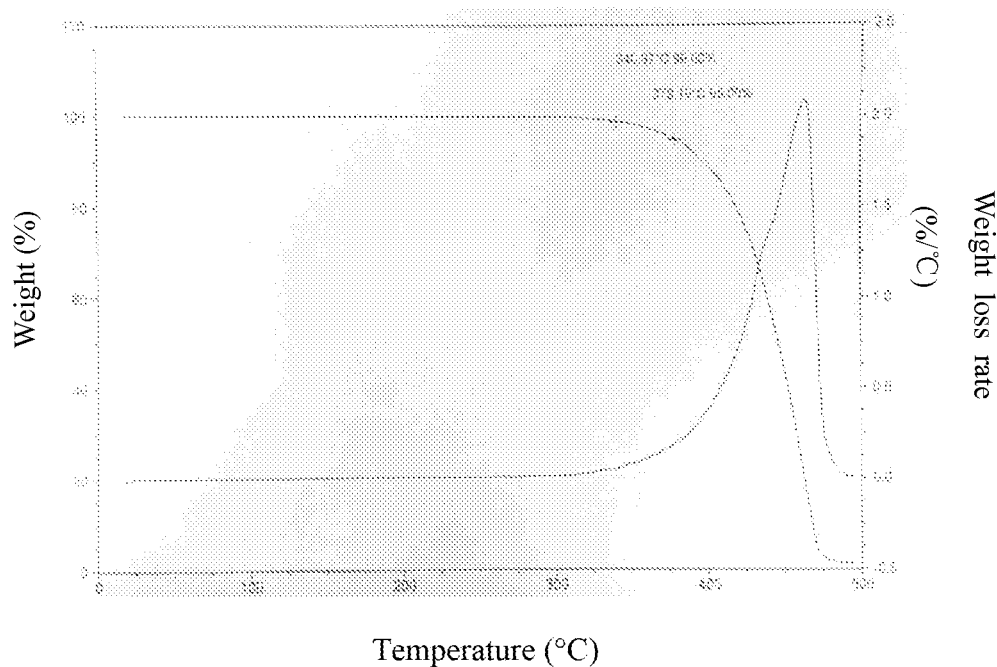
FIG. 1 is a TGA Thermo Gravimetric Analysis diagram of the phosphorus-containing flame retardant prepared in the example 1.
Figure 2:
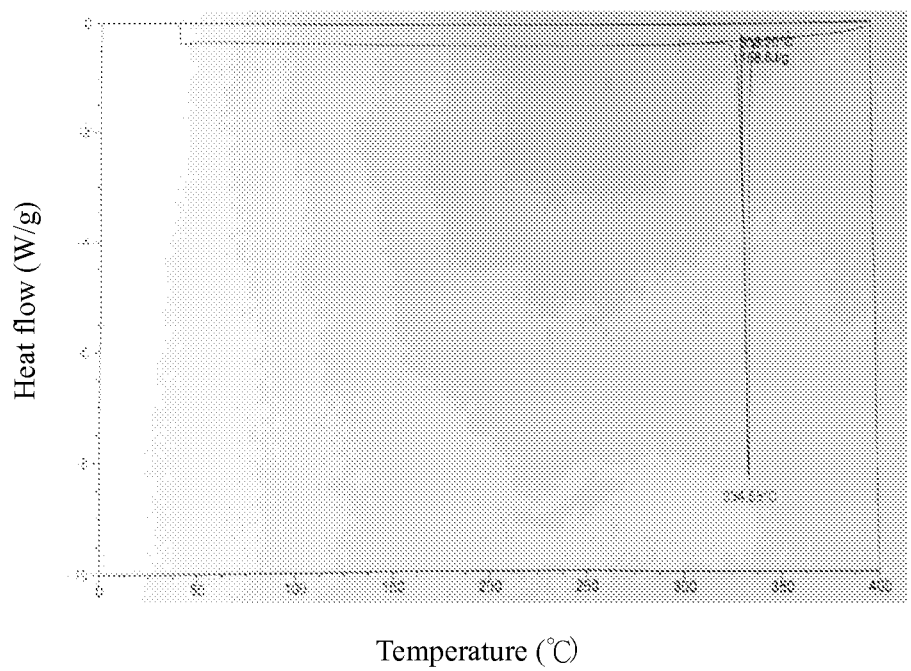
FIG. 2 is a DSC melting point diagram of the phosphorus-containing flame retardant prepared in example 1.

Analysis: the Td value measured from the TGA test was: 379° C. (at 5% decomposition, the results shown in FIG. 1); the melting point measured from the DSC test was 334° C. (the results shown in FIG. 2), whereas in the prior art, the melting point of the phosphazene compound (SPB-100) was 110° C., the melting point of the condensed phosphate (PX-200) was 105° C., and the phosphorus-containing phenolic novolac resin, such as DOPO-bisphenol A phenolic novolac resin, was a liquid resin at the ambient temperature. Therefore, the phosphorus-containing flame retardant prepared in the present invention had a higher melting point.

Figure 3:
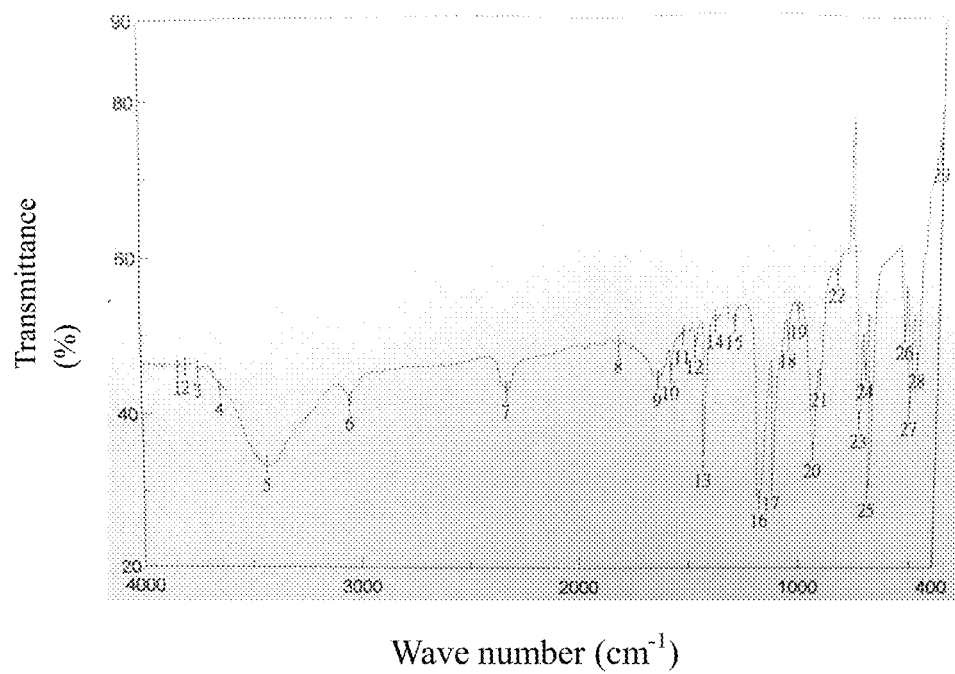
FIG. 3 is a FTIR spectrogram of DPPO.
Figure 4:
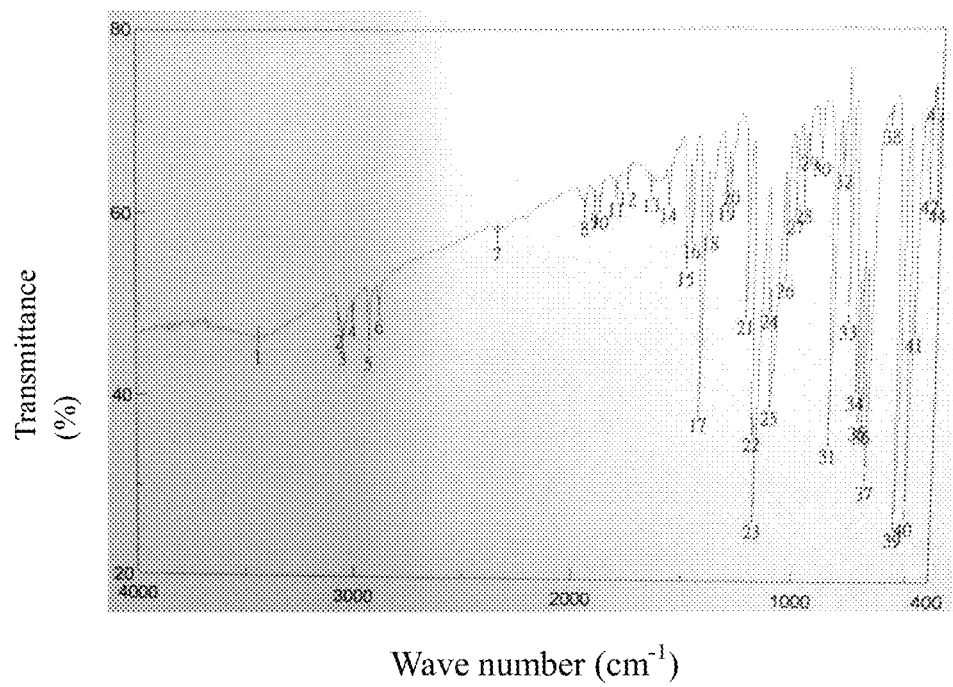
FIG. 4 is a FTIR spectrogram of the phosphorus-containing flame retardant prepared in example 1.

The DPPO and Compound A were carried out an infrared scanning, and the peak analysis were shown in tables 1~2 and FIGS. 3~4, and as shown in the figures, the P-H functional group of the DPPO had a peak at 2300 cm$^{-1}$~2354 cm$^{-1}$ on FTIR, which was disappeared in the infrared spectra of the synthesized Compound A, which demonstrated that the object product, Compound A having a structure as shown in formula (III), was prepared successfully.

(III)

TABLE 1

The peak analysis of the infrared spectrum of the DPPO

| No. | Position | Intensity | No. | Position | Intensity |
|-----|----------|-----------|-----|----------|-----------|
| 1 | 3835.72 | 45.8092 | 2 | 3799.08 | 45.9235 |
| 3 | 3747.01 | 45.5569 | 4 | 3646.73 | 43.2362 |
| 5 | 3438.46 | 33.4289 | 6 | 3056.62 | 41.4701 |
| 7 | 2337.3 | 43.0893 | 8 | 1826.26 | 48.9266 |
| 9 | 1648.84 | 44.5571 | 10 | 1590.99 | 45.4855 |
| 11 | 1540.85 | 49.9950 | 12 | 1484.92 | 48.6728 |
| 13 | 1438.64 | 34.1160 | 14 | 1398.14 | 51.8242 |
| 15 | 1313.29 | 51.6502 | 16 | 1182.15 | 28.7802 |
| 17 | 1126.22 | 31.0794 | 18 | 1070.3 | 49.3251 |
| 19 | 1025.94 | 52.9918 | 20 | 948.806 | 35.1476 |
| 21 | 921.807 | 44.3150 | 22 | 856.239 | 57.5654 |
| 23 | 746.317 | 38.9094 | 24 | 721.247 | 45.3299 |
| 25 | 696.177 | 30.0476 | 26 | 551.542 | 50.2220 |
| 27 | 524.543 | 40.5313 | 28 | 493.688 | 46.5779 |
| 29 | 404.978 | 72.7421 | | | |

TABLE 2

The peak analysis of the infrared spectrum of Compound A

| No. | Position | Intensity | No. | Position | Intensity | No. | Position | Intensity | No. | Position | Intensity |
|---|---|---|---|---|---|---|---|---|---|---|---|
| 1 | 3442.31 | 46.5563 | 2 | 3073.98 | 48.3190 | 37 | 692.32 | 31.8651 | 38 | 615.181 | 70.4798 |
| 3 | 3056.62 | 46.5098 | 4 | 3010.34 | 49.4743 | 39 | 559.255 | 26.8222 | 40 | 512.972 | 27.9870 |
| 5 | 2935.13 | 45.9393 | 6 | 2888.84 | 49.9798 | 41 | 495.616 | 42.9809 | 42 | 447.404 | 62.9133 |
| 7 | 2354.66 | 57.9169 | 8 | 1965.11 | 60.7359 | 43 | 428.12 | 72.8920 | 44 | 412.692 | 61.9466 |
| 9 | 1920.75 | 61.5511 | 10 | 1897.61 | 61.3681 | | | | | | |
| 11 | 1824.33 | 62.7822 | 12 | 1776.12 | 63.8974 | | | | | | |
| 13 | 1670.05 | 63.3185 | 14 | 1590.99 | 62.1484 | | | | | | |
| 15 | 1509.99 | 55.2477 | 16 | 1484.92 | 58.2636 | | | | | | |
| 17 | 1436.71 | 39.4720 | 18 | 1403.92 | 59.0824 | | | | | | |
| 19 | 1336.43 | 62.2717 | 20 | 1317.14 | 63.9278 | | | | | | |
| 21 | 1236.15 | 50.0672 | 22 | 1195.65 | 37.3148 | | | | | | |
| 23 | 1182.15 | 27.7416 | 24 | 1132.01 | 50.5852 | | | | | | |
| 25 | 1118.51 | 40.1215 | 26 | 1068.37 | 53.9037 | | | | | | |
| 27 | 1029.8 | 60.6920 | 28 | 997.017 | 61.8595 | | | | | | |
| 29 | 977.733 | 67.5493 | 30 | 921.807 | 66.9168 | | | | | | |
| 31 | 858.168 | 35.9386 | 32 | 823.455 | 65.5616 | | | | | | |
| 33 | 786.815 | 49.2939 | 34 | 746.317 | 41.7239 | | | | | | |
| 35 | 730.889 | 38.3904 | 36 | 713.533 | 39.0719 | | | | | | |

Example 2: Preparation of the Low Dielectric Resin Composition with Phosphorus-Containing Flame Retardant The relevant components were mixed thoroughly according to the formulations as shown in tables 3~8, thus obtaining the resin varnishes of the resin compositions, wherein E represented the low dielectric resin composition with phosphorus-containing flame retardant of the present invention, and C represented the comparative example.

TABLE 3

The formulation list of the low dielectric resin composition with phosphorus-containing flame retardant (unit: parts by weight)

| Resin composition | Components | | E1 | E2 | C1 | C2 | C3 | C4 | C5 | C6 |
|---|---|---|---|---|---|---|---|---|---|---|
| Flame retardant | High melting point phosphorus-containing flame retardant | Compound A | 35 | 35 | | | | 35 | | 35 |
| | Low melting point phosphorus-containing flame retardant | SPB-100 | | | 35 | | | | 35 | |
| | Condensed phosphate | PX-200 | | | | 35 | | | | |
| | Hydroxyl-containing phosphorus-containing flame retardant | XZ92741 | | | | | 35 | | | |
| Vinyl compound | Vinylbenzylether polyphenylene ether | OPE-2st | 100 | 100 | 100 | 100 | 100 | | | |
| | Methacrylate polyphenylene ether | SA-9000 | | | | | | 100 | 100 | 100 |
| | Maleimide | Homide 108 | | 30 | | | | | | 30 |
| Peroxide | Peroxide | DCP | 3 | 3 | 3 | 3 | 3 | 3 | 3 | 3 |
| Inorganic filler | Spherical silicon dioxide | SE5500 | 60 | 60 | 60 | 60 | 60 | 60 | 60 | 60 |
| Solvent | Toluene | | 100 | 100 | 100 | 100 | 100 | 100 | 100 | 100 |
| | Butanone | | 30 | 30 | 30 | 30 | 30 | 30 | 30 | 30 |

TABLE 4

The formulation list of the low dielectric resin composition with phosphorus-containing flame retardant (unit: parts by weight)

| Resin composition | Components | | E3 | E4 | E5 | E6 | E7 | E8 |
|---|---|---|---|---|---|---|---|---|
| Flame retardant | High melting point phosphorus-containing flame retardant | Compound A | 35 | 45 | 45 | 45 | 50 | 35 |
| | Low melting point phosphorus-containing flame retardant | SPB-100 | | | | | | |
| | Condensed phosphate | PX-200 | | | | | | |
| | Hydroxyl-containing phosphorus-containing flame retardant | XZ92741 | | | | | | |

TABLE 4-continued

The formulation list of the low dielectric resin composition with phosphorus-containing flame retardant (unit: parts by weight)

| Resin composition | Components | | E3 | E4 | E5 | E6 | E7 | E8 |
|---|---|---|---|---|---|---|---|---|
| Vinyl compound | Vinylbenzyl ether polyphenylene ether | OPE-2st | 100 | 100 | 100 | 100 | 100 | 100 |
| | Styrene-polybutadiene-divinylbenzene | Ricon257 | | 30 | 15 | 15 | 60 | |
| | Styrene-polybutadiene-maleic anhydride copolymer | Ricon184MA6 | | | 15 | 15 | | 5 |
| | Maleimide | Homide108 | | | | 30 | | |
| Peroxide | Peroxide | DCP | 3 | 3 | 3 | 3 | 3 | 3 |
| Inorganic filler | Spherical silicon dioxide | SE-5500 | 60 | 60 | 60 | 60 | 60 | 60 |
| Solvent | Toluene | | 100 | 100 | 100 | 100 | 100 | 100 |
| | Butanone | | 30 | 30 | 30 | 30 | 30 | 30 |

TABLE 5

The formulation list of the low dielectric resin composition with phosphorus-containing flame retardant (unit: parts by weight)

| Resin composition | Components | | E9 | E10 | E11 | E12 | E13 | E14 |
|---|---|---|---|---|---|---|---|---|
| Flame retardant | High melting point phosphorus-containing flame retardant | Compound A | 45 | 45 | 90 | 25 | 70 | 70 |
| | Low melting point phosphorus-containing flame retardant | SPB-100 | | | | | | |
| | Condensed phosphate | PX-200 | | | | | | |
| | Hydroxyl-containing phosphorus-containing flame retardant | XZ92741 | | | | | | |
| Vinyl compound | Vinylbenzyl ether polyphenylene ether | OPE-2st | 100 | 100 | 100 | 100 | 100 | 100 |
| | Styrene-polybutadiene-divinylbenzene | Ricon257 | | | | | 35 | 35 |
| | Polybutadiene-urethane-methyl methacrylate | R-45vt | | | | | | 15 |
| | Styrene-polybutadiene-maleic anhydride copolymer | Ricon184MA6 | | | | | 7.5 | 7.5 |
| | maleimide | Homide108 | 50 | 15 | | | 35 | 35 |
| Peroxide | Peroxide | DCP | 3 | 3 | 3 | 3 | 3 | 3 |
| Inorganic filler | Spherical silicon dioxide | SQ-5500 | 60 | 60 | 60 | 60 | 60 | 60 |
| Solvent | Toluene | | 100 | 100 | 100 | 100 | 100 | 100 |
| | Butanone | | 30 | 30 | 30 | 30 | 30 | 30 |

TABLE 6

The formulation list of the low dielectric resin composition with phosphorus-containing flame retardant (unit: parts by weight)

| Resin composition | Components | | E15 | E16 |
|---|---|---|---|---|
| Flame retardant | High melting point phosphorus-containing flame retardant | Compound A | 70 | 70 |
| | Low melting point phosphorus-containing flame retardant | SPB-100 | | |
| | Condensed phosphate | PX-200 | | |
| | Hydroxyl-containing phosphorus-containing flame retardant | XZ92741 | | |

TABLE 6-continued

The formulation list of the low dielectric resin composition with phosphorus-containing flame retardant (unit: parts by weight)

| Resin composition | Components | | E15 | E16 |
|---|---|---|---|---|
| vinyl compound | Vinylbeznyl etherified-dicyclopentadiene-phenol resin | DP-85T | 50 | 30 |
| | Styrene-polybutadiene-divinylbenzene | Ricon257 | 35 | 30 |
| | Modified vinylpolyphenylene ether resin | PPE/VBE 7205L | 50 | 70 |
| | Styrene-polybutadiene-maleic anhydride copolymer | Ricon184MA6 | 7.5 | 7.5 |
| | Maleimide | Homide108 | 35 | 35 |
| Peroxide | Peroxide | DCP | 3 | 3 |
| Inorganic filler | Spherical silicon dioxide | SQ-5500 | 60 | 60 |
| Solvent | Toluene | | 100 | 100 |
| | Butanone | | 30 | 30 |

TABLE 7

The formulation list of the low dielectric resin composition with phosphorus-containing flame retardant (unit: parts by weight)

| Resin composition | Components | | C7 | C8 | C9 | C10 | C11 |
|---|---|---|---|---|---|---|---|
| Flame retardant | High melting point phosphorus-containing flame retardant | Compound A | 100 | 20 | | | |
| | Low melting point phosphorus-containing flame retardant | SPB-100 | | | 70 | | |
| | Condensed phosphate | PX-200 | | | | 70 | |
| | Hydroxyl-containing phosphorus-containing flame retardant | XZ92741 | | | | | 70 |
| Vinyl compound | Vinylbenzyl ether polyphenylene ether | OPE-2st | 100 | 100 | 100 | 100 | 100 |
| | Styrene-polybutadiene-divinylbenzene | Ricon257 | 35 | | 35 | 35 | 35 |
| | Styrene-polybutadiene-maleic anhydride copolymer | Ricon184MA6 | 7.5 | | 7.5 | 7.5 | 7.5 |
| | Maleimide | Homide108 | 35 | | 35 | 35 | 35 |
| Peroxide | Peroxide | DCP | 3 | 3 | 3 | 3 | 3 |
| Inorganic filler | Spherical silicon dioxide | SQ5500 | 60 | 60 | 60 | 60 | 60 |
| Solvent | Toluene | | 100 | 100 | 100 | 100 | 100 |
| | Butanone | | 30 | 30 | 30 | 30 | 30 |

TABLE 8

The formulation list of the low dielectric resin composition with phosphorus-containing flame retardant (unit: parts by weight)

| Resin composition | Components | | C12 | C13 | C14 | C15 | C16 | C17 |
|---|---|---|---|---|---|---|---|---|
| Flame retardant | High melting point phosphorus-containing flame retardant | Compound A | 70 | 70 | 70 | 70 | 70 | 70 |
| | Low melting point phosphorus-containing flame retardant | SPB-100 | | | | | | |
| | Condensed phosphate | PX-200 | | | | | | |
| | Hydroxyl-containing phosphorus-containing flame retardant | XZ92741 | | | | | | |
| Vinyl compound | Vinylbenzyl ether polyphenylene ether | OPE-2st | 100 | 100 | 100 | 100 | 100 | 100 |
| | Styrene-polybutadiene-divinylbenzene | Ricon257 | 70 | 5 | 35 | 35 | 35 | 35 |
| | Polybutadiene-urethane-methyl methacrylate | R-45vt | | | | | | |

TABLE 8-continued

The formulation list of the low dielectric resin composition with phosphorus-containing flame retardant (unit: parts by weight)

| Resin composition | Components | | C12 | C13 | C14 | C15 | C16 | C17 |
|---|---|---|---|---|---|---|---|---|
| | Styrene-polybutadiene-maleic anhydride copolymer | Ricon184MA6 | 7.5 | 7.5 | 20 | 1 | 7.5 | 7.5 |
| | Maleimide | Homide108 | 35 | 35 | 35 | 35 | 60 | 10 |
| Peroxide | Peroxide | DCP | 3 | 3 | 3 | 3 | 3 | 3 |
| Inorganic filler | Spherical silicon dioxide | SQ5500 | 60 | 60 | 60 | 60 | 60 | 60 |
| Solvent | Toluene | | 100 | 100 | 100 | 100 | 100 | 100 |
| | Butanone | | 30 | 30 | 30 | 30 | 30 | 30 |

Example 3: Preparation of the Low Dielectric Composite Material

The resin varnishes of the resin compositions prepared in the abovementioned E1~E16 and C1~C17 were coated onto the PET films (or PI films) respectively, to make the resin compositions (with a thickness of 30 μm) uniformly adhered onto the films, then heated and baked into a semi-cured state, thus obtaining the resin films. Among them, the baking conditions in E1~E16 and C3, C4 were baking at 160° C. for 4 mins; the baking conditions in C1, C2 and C5~C17 were baking at 120° C. for 4 mins.

Example 4: Preparation of the Low Dielectric Composite Material

The resin varnishes of the resin compositions prepared in the abovementioned E1~E16 and C1~C17 were coated onto the copper foils respectively, to make the resin compositions (with a thickness of 30 μm) uniformly adhered thereon, then heated and baked into a semi-cured state, thus obtaining the resin coated coppers. Among them, the baking conditions in E1~E16 and C3, C4 were baking at 160° C. for 4 mins; and the baking conditions in C1, C2 and C5~C17 were baking at 120° C. for 4 mins.

Example 5: Preparation of the Low Dielectric Composite Material

The resin varnishes of the resin compositions prepared in the abovementioned E1~E16 and C1~C17 were coated onto the PI film on the adhesive surface of the resin coated coppers respectively, and obtained a structure of copper, PI film, and resin composition, to make the resin compositions (with a thickness of about 30 μm) uniformly adhered thereon, and heated and baked into a semi-cured state, thus obtaining the flexible resin coated coppers. Among them, the baking conditions in E1~E16 and C3, C4 were baking at 160° C. for 4 mins; and the baking conditions in C1, C2 and C5~C17 were baking at 120° C. for 4 mins. Among them, the PI film can be at least one of TPI (thermoplastic polyimide) and PI (polyimide).

Example 6: Preparation of the Low Dielectric Composite Material

The resin varnishes of the resin compositions prepared in the abovementioned E1~E16 and C1~C17 were placed into an impregnation tank respectively, then a glass fiber cloth (2116 glass fiber cloth, purchased from Nan Ya Plastics Corporation) was passed through the abovementioned impregnation tank, to make the resin composition adhered onto the glass fiber cloth, then heated and baked into a semi-cured state, thus obtaining a prepreg.

Four sheets of the prepregs taken from each type of the prepregs prepared above respectively, and two sheets of 18 μm coppers were superimposed in the order of copper foil, four sheets of the prepregs, and copper foil, then laminated in vacuum at 210° C. for 2 hours, thus forming a copper clad laminate, wherein the four sheets of the prepregs were cured and formed an insulating layer between the two sheets of coppers.

The physical properties of the abovementioned copper clad laminates and the copper-free laminates after etching off the copper foil were determined respectively, including the copper-free laminates obtained by laminating four sheets of the prepregs, with a resin content of about 55%, except that the dielectric constants and dissipation factors were determined on the copper-free laminates made from two sheets of prepregs, the other physical properties of the copper-free laminates were all determined on the laminates made from four sheets of the prepregs, and the physical properties to be determined comprised glass transition temperature (Tg, measured on a DMA (Dynamic Mechanical Analysis) instrument, IPC-TM-650 2.4.24.4), heat resistance (T288, measured by TMA (Thermo Mechanical Analyzer), wherein the copper clad laminate was measured for the time that the plate did not burst during heating at 288° C., IPC-TM-650 2.4.24.1), thermal expansion ratio (CTE z-axis, dimension change: 50~260° C., measured on a TMA Thermo Mechanical Analyzer instrument, IPC-TM-650 2.4.24.5, %, the lower dimension changes representing the better results), copper clad laminate solder dip test (solder dipping, S/D, 288° C., 10 sec, measured the number of heat cycles), dielectric constant (Dk, measured on an AET microwave dielectric analyzer, JIS C2565, the lower Dk values representing the better dielectric properties), dissipation factor (Df, measured on an AET microwave dielectric analyzer, JIS C2565, the lower Df values representing the better dielectric properties), and flame resistance (flaming test, UL94, with the grade rank V-0 being better than V-1).

Among them, the performance testing results of the composite materials prepared from the resin compositions in E1~E2 and C1~C6 were listed in table 9, and the performance testing results of the composite materials prepared from the resin compositions in E3~E16 and C7~C17 were listed tables 10~12. Compared the examples with the comparative examples synthetically, it can be seen that as compared those using Compound A with those using the general phosphorus-containing additives, the results showed that the composite materials of the present invention had lower Dk and Df values, and lower thermal expansion ratio (the dimension change in z-axis).

TABLE 9

The performance indexes of the low dielectric composite material of the present invention

| Property | Test method | E1 | E2 | C1 | C2 | C3 | C4 | C5 | C6 |
|---|---|---|---|---|---|---|---|---|---|
| Tg | DMA instrument (IPC-TM-650 2.4.24.4/° C.) | 195 | 215 | 185 | 160 | 178 | 205 | 188 | 206 |
| CTE (50~260° C.) | Measurement on a TMA instrument (IPC-TM-650 2.4.24.5,), % | 2.1 | 1.8 | 3.1 | 3.4 | 2.8 | 2.4 | 3.1 | 2.4 |
| T288 | At 288° C., heat resistance, IPC-TM-650 2.4.24.1/min | 64 | >70 | 60 | 30 | 15 | 63 | 60 | 68 |
| S/D | Solder dipping test, 288° C., 10 sec, measured the number of heat cycles | >20 | >20 | >20 | 15 | 8 | >20 | >20 | >20 |
| Dk | 10 GHz, AET microwave dielectric analyzer, JIS C2565 | 3.5 | 3.5 | 3.6 | 3.6 | 3.7 | 3.5 | 3.5 | 3.5 |
| Df | 10 GHz, AET, microwave dielectric analyzer, JIS C2565 | 0.0048 | 0.0053 | 0.0059 | 0.0055 | 0.0110 | 0.0065 | 0.0065 | 0.0066 |
| Flame resistance | Burning test UL94 | V-0 | V-0 | V-1 | V-2 | V-1 | V-0 | V-0 | V-0 |

TABLE 10

The performance indexes of the low dielectric composite material of the present invention

| Property | Test method | E3 | E4 | E5 | E6 | E7 | E8 | E9 | E10 |
|---|---|---|---|---|---|---|---|---|---|
| Tg | DMA instrument (IPC-TM-650 2.4.24.4/° C.) | 195 | 198 | 193 | 210 | 188 | 195 | 230 | 205 |
| CTE (50~260) | Measurement on a TMA instrument (r IPC-TM-650 2.4.24.5,), % | 2.1 | 2.5 | 2.5 | 1.9 | 2.8 | 2.3 | 1.5 | 2 |
| T288 | At 288° C., heat resistance, IPC-TM-650 2.4.24.1/min | 61 | 62 | 63 | >70 | 55 | 65 | >70 | >70 |
| S/D | Solder dipping test, 288° C., 10 sec, measured the number of heat cycles | >20 | >20 | >20 | >20 | >20 | >20 | >20 | >20 |
| Dk | 10 GHz, AET microwave dielectric analyzer, JIS C2565 | 3.5 | 3.4 | 3.5 | 3.5 | 3.5 | 3.6 | 3.6 | 3.5 |
| Df | 10 GHz, AET microwave dielectric analyzer, JIS C2565 | 0.0048 | 0.0045 | 0.0045 | 0.0056 | 0.0043 | 0.0055 | 0.0059 | 0.0058 |
| Flame resistance | Burning test UL94 | V-0 | V-0 | V-0 | V-0 | V-0 | V-0 | V-0 | V-0 |

TABLE 11

The performance indexes of the low dielectric composite material of the present invention

| Property | Test method | E11 | E12 | E13 | E14 | E15 | E16 | C7 | C8 |
|---|---|---|---|---|---|---|---|---|---|
| Tg | DMA instrument (IPC-TM-650 2.4.24.4/° C.) | 202 | 195 | 212 | 215 | 210 | 203 | 212 | 185 |
| CTE (50~260) | Measurement on a TMA instrument (IPC-TM-650 2.4.24.5,), % | 2.6 | 2.5 | 1.9 | 1.9 | 2.5 | 2.7 | 1.8 | 3 |

TABLE 11-continued

The performance indexes of the low dielectric composite material of the present invention

| Property | Test method | E11 | E12 | E13 | E14 | E15 | E16 | C7 | C8 |
|---|---|---|---|---|---|---|---|---|---|
| T288 | At 288° C., heat resistance, IPC-TM-650 2.4.24.1/min | 30 | 65 | >70 | >70 | >70 | >70 | >70 | 64 |
| S/D | Solder dipping test, 288° C., 10 sec, measured the number of heat cycles | >20 | >20 | >20 | >20 | >20 | >20 | >20 | >20 |
| Dk | 10 GHz, AET microwave dielectric analyzer, JIS C2565 | 3.7 | 3.5 | 3.5 | 3.5 | 3.4 | 3.5 | 3.8 | 3.6 |
| Df | 10 GHz, AET microwave dielectric analyzer, JIS C2565 | 0.0059 | 0.0051 | 0.0053 | 0.0053 | 0.0052 | 0.0053 | 0.0061 | 0.0051 |
| Flame resistance | Burning test UL94 | V-0 | V-0 | V-0 | V-0 | V-0 | V-0 | V-0 | Burn out |

TABLE 12

The performance indexes of low dielectric composite material of the present invention

| Property | Test method | C9 | C10 | C11 | C12 | C13 | C14 | C15 | C16 | C17 |
|---|---|---|---|---|---|---|---|---|---|---|
| Tg | DMA instrument (IPC-TM-650 2.4.24.4/° C.) | 180 | 175 | 185 | 155 | 195 | 190 | 196 | 235 | 190 |
| CTE (50~260) | Measurement on a TMA instrument (IPC-TM-650 2.4.24.5,), % | 3.1 | 3.1 | 2.8 | 3.8 | 2.2 | 2.8 | 2.2 | 1.5 | 2.8 |
| T288 | At 288° C., heat resistance, IPC-TM-650 2.4.24.1/min | 64 | 30 | 15 | 15 | 50 | 55 | 58 | >70 | 57 |
| S/D | Solder dipping test, 288° C., 10 sec, measured the number of heat cycles | >20 | >20 | 15 | 15 | >20 | >20 | >20 | >20 | >20 |
| Dk | 10 GHz, AET microwave dielectric analyzer, JIS C2565 | 3.7 | 3.7 | 4.1 | 3.3 | 3.5 | 3.7 | 3.5 | 3.7 | 3.6 |
| Df | 10 GHz, AET microwave dielectric analyzer, JIS C2565 | 0.0061 | 0.0058 | 0.0120 | 0.0048 | 0.0059 | 0.0057 | 0.0057 | 0.006 | 0.0058 |
| Flame resistance | Burning test UL94 | V-2 | Burn out | V-1 | V-0 | V-0 | V-0 | V-0 | V-0 | V-0 |

The Result Analysis:

It can be seen from the data in the abovementioned tables, that as compared with those in C1~C6, those in E1 and E2 in the present invention substantially had lower dimension changes, and the laminates prepared therefrom had lower thermal expansion ratios. At the same time, the low dielectric composite materials of the present invention had excellent heat resistances. As compared E1 and E2 with C1~C3, it can be seen that the low dielectric resin compositions of the present invention had excellent flame resistances and can effectively achieve the flame resistance effects of UL94 V-0, due to containing the specific phosphorus-containing flame retardants.

As compared the data in E4~E7 with those in C8~C12, it can be seen that the low dielectric composite materials of the present invention further decreased the dissipation factors, obtained better dielectric properties, and made the systems achieved better dielectric properties (the lower dielectric properties representing the better results) due to the addition of the styrene polymer.

As compared the data in E13 and E14 of the present invention with those in C7, it can be seen that the formulation combination, under which the low dielectric resin compositions with phosphorus-containing flame retardants of the present invention had the highest thermal stabilities, and lower thermal expansion ratios and better dielectric properties, was the best formulation.

As described above, the low dielectric resin compositions with phosphorus-containing flame retardants of the present invention, due to containing the specific components and proportions, can achieve low thermal expansion ratios, low dielectric constants, low dissipation factors, high heat resistances and high flame resistances; and can be made into prepregs or resin films, and in turn achieved the purpose for applying in copper clad laminates and printed circuit boards; and in terms of the industrial availability, the requirements on the current market can be fully met by using the products derived from the present invention.

The abovementioned examples are the preferred embodiments of the present invention, but the embodiments of the present invention are not limited thereto, any other changes, modifications, substitutions, combinations and simplifications, all of which shall be the equivalent replacements, without departing from the spirit and principle of the present invention, are all encompassed in the scope of protection of the present invention.

The invention claimed is:

1. A low dielectric composite material made from a low dielectric resin composition with phosphorus-containing flame retardant and a substrate, the low dielectric resin composition with phosphorus-containing flame retardant comprising the following components:

(A) 25 to 90 parts by weight of a phosphorus-containing flame retardant; and (B) 100 parts by weight of a vinyl compound;

wherein, the phosphorus-containing flame retardant has a structure as shown in formula (I)

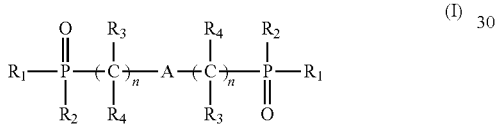

wherein, A is a covalent bond, C6~C12 arylene, C3~C12 cycloalkylene, C6~C12 cycloalkenylene, methylene or C2~C12 alkylene; $R_1$ and $R_2$ are the same or different, and are each an H, alkoxy, aryloxy, alkyl, aryl or silyl, respectively; $R_3$ and $R_4$ are the same or different, and are each an H, hydroxyl, and C1~C6 alkyl, respectively, or one and only one of $R_3$ and $R_4$ forms a carbonyl with a C; each of n is a positive integer of 1~6 independently, wherein the vinyl compound is a vinyl polyphenylene ether resin having a structure as shown below in formula (XVI)

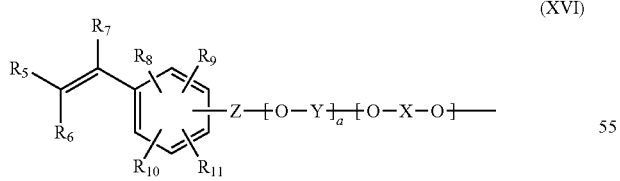

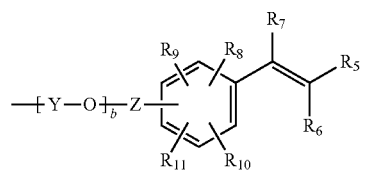

wherein, —(O—X—O)— refers to

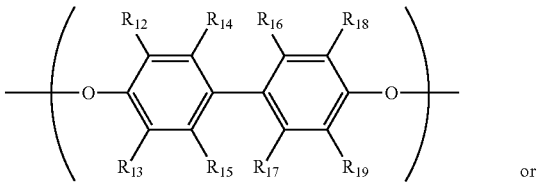

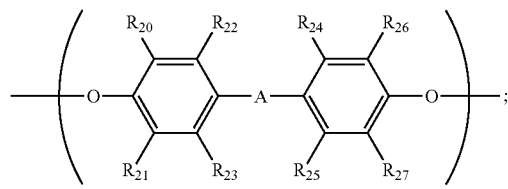

—(Y—O)— refers to

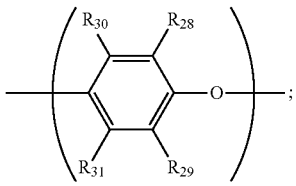

$R_5$ and $R_6$ are each a hydrogen atom, $R_7$, $R_8$, $R_9$, $R_{10}$ and $R_{11}$ are the same or different, and are each a hydrogen atom, halogen atom, alkyl, or halogen-substituted alkyl;

$R_{12}$, $R_{13}$, $R_{18}$ and $R_{19}$ are the same or different, and are each a halogen atom, C1-C6 alkyl or phenyl;

$R_{14}$, $R_{15}$, $R_{16}$ and $R_{17}$ are the same or different, and are each a hydrogen atom, halogen atom, C1-C6 alkyl or phenyl;

$R_{20}$, $R_{21}$, $R_{22}$, $R_{23}$, $R_{24}$, $R_{25}$, $R_{26}$ and $R_{27}$ are the same or different, and are each a halogen atom, C1-C6 alkyl, phenyl or hydrogen atom; A is a C1-C20 linear, branched, or cyclic alkylene;

$R_{28}$ and $R_{29}$ are the same or different, and are each a halogen atom, C1-C6 alkyl or phenyl;

$R_{30}$ and $R_{31}$ are the same or different, and are each a hydrogen atom, halogen atom, C1~C6 alkyl or phenyl;

Z represents an organic group having at least one carbon atom; and a and b are each a natural number of 1~30, respectively.

2. The low dielectric composite material with phosphorus-containing flame retardant of claim 1, wherein the substrate is one of a fiber material, a woven or non-woven, a PET film, a PI film, a copper foil, and resin coated copper.

3. The low dielectric composite material with phosphorus-containing flame retardant of claim 1, wherein the phosphorus-containing flame retardant has at least one of the structures as shown in the following formulae (II)~(XV):

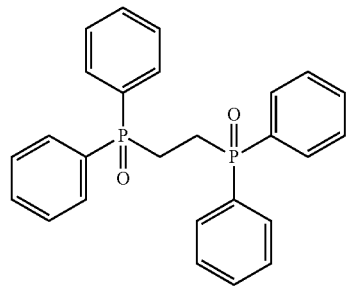
(II)
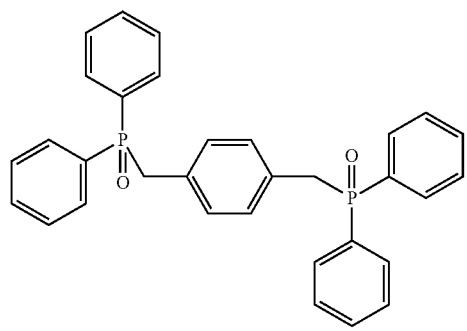
(III)
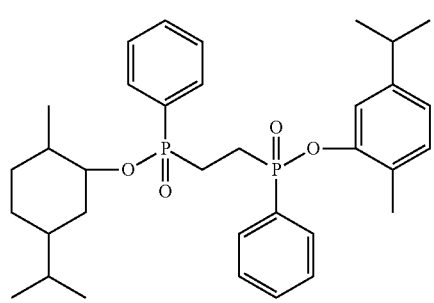
(IV)
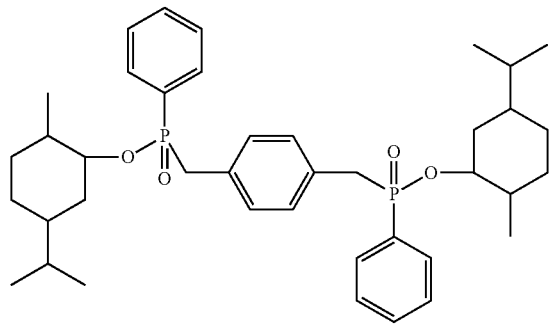
(V)
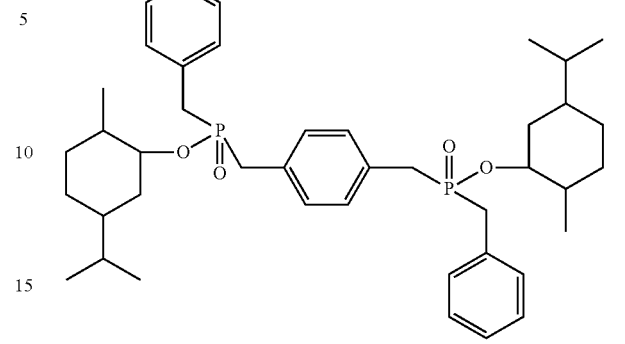
(VI)
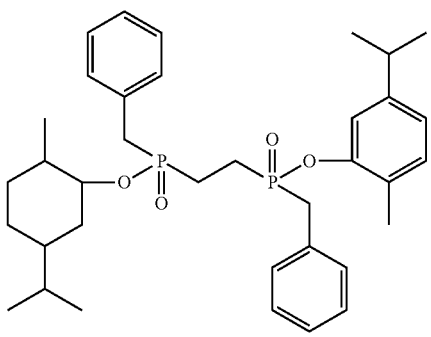
(VII)
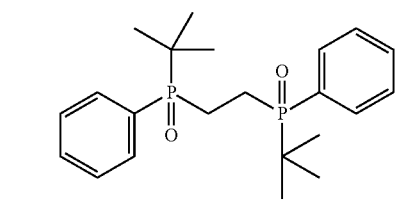
(VIII)
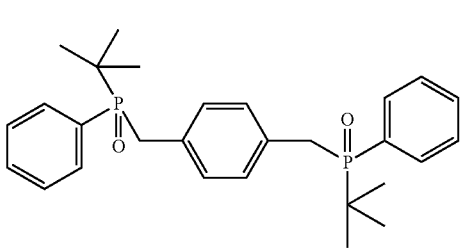
(IX)
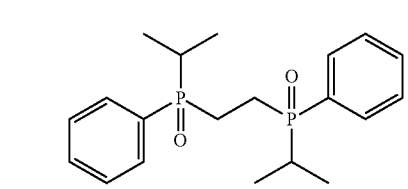
(X)
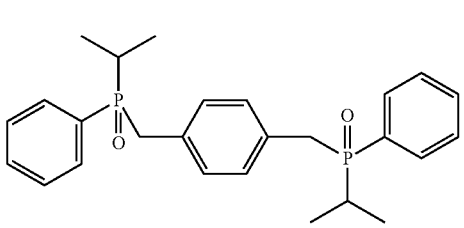
(XI)

-continued

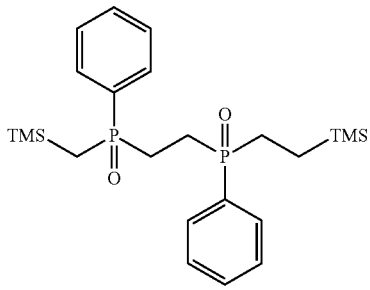

(XII)

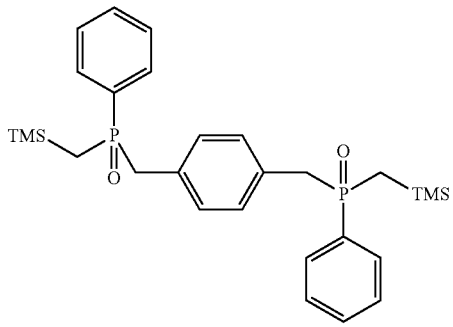

(XIII)

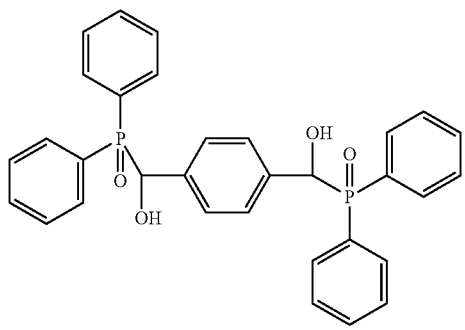

(XIV)

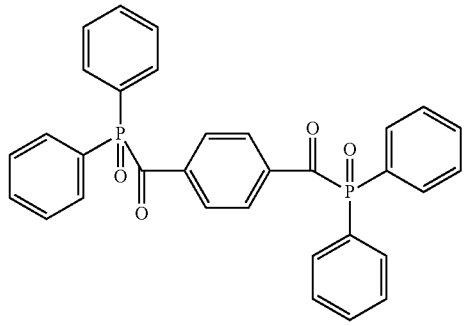

(XV)

wherein, TMS represents trimethylsilyl.

4. The low dielectric composite material of claim 1, further comprising a vinylbenzyl compound resin, a polyolefin compound, a maleimide resin or a combination thereof.

5. The low dielectric composite material of claim 4, wherein
the vinylbenzyl compound resin is vinylbenzyl etherified-bicyclopentadiene phenol resin;
the polyolefin compound is at least one of styrene-butadiene-divinylbenzene copolymer, hydrogenated styrene-butadiene-divinylbenzene copolymer, styrene-butadiene-maleic anhydride copolymer, polybutadiene-urethane-methyl methacrylate copolymer, styrene-butadiene copolymer, polybutadiene homopolymer, styrene-isoprene-styrene copolymer, maleinized styrene-butadiene copolymer, methylstyrene copolymer, petroleum resin and cyclic olefin copolymer; and
the maleimide resin is at least one of 4,4'-bismaleimido-diphenyl methane, phenylmethane maleimide oligomer, N,N'-m-phenylene bismaleimide, bisphenol A diphenyl ether bismaleimide, 3,3'-dimethyl-5,5'-diethyl-4,4'-diphenylmethane bismaleimide, N,N'-(4-methyl-1,3-phenylene) bismaleimide, 1,6-bismaleimido-(2,2,4-trimethyl)hexane, 2,3-dimethylphenylmaleimide, 2,6-dimethylphenylmaleimide, N-phenylmaleimide and the prepolymer of the abovementioned compound.

6. The low dielectric composite material of claim 1, wherein the low dielectric composite material is particularly prepared by the following method: the low dielectric resin composition with phosphorus-containing flame retardant is dissolved in a solvent, and made into a resin varnish, then adhered onto a substrate in a impregnation or coating means, and formed into a semi-cured state through heating at a temperature from 100° C. to 170° C., thus obtaining the low dielectric composite material.

7. The low dielectric composite material of claim 2, wherein the low dielectric composite material is particularly prepared by the following method: the low dielectric resin composition with phosphorus-containing flame retardant is dissolved in a solvent, and made into a resin varnish, then impregnated onto the substrate formed by the fiber material, woven or non-woven, and formed into a semi-cured state through heating at a temperature from 100° C. to 170° C., thus obtaining a prepreg.

8. The low dielectric composite material of claim 1, wherein the low dielectric composite material is particularly prepared by the following method: the low dielectric resin composition with phosphorus-containing flame retardant is dissolved in a solvent, and made into a resin varnish, then coated onto a PET film or PI film, and formed into a semi-cured state through heating at a temperature from 100° C. to 170° C., thus obtaining a resin film.

9. The low dielectric composite material of claim 1, wherein the low dielectric composite material is particularly prepared by the following method: the low dielectric resin composition with phosphorus-containing flame retardant is dissolved into a solvent, and made into a resin varnish, then coated onto a copper or the PI film of a PI film-coated copper, and formed into a semi-cured state through heating at a temperature from 100° C. to 170° C., thus obtaining a resin coated copper.

10. A laminate made from a low dielectric composite material the low dielectric composite material made from a low dielectric resin composition with a phosphorus-containing flame retardant and a substrate, the low dielectric resin composition with phosphorus-containing flame retardant comprising the following components:
(A) 25 to 90 parts by weight of a phosphorus-containing flame retardant; and
(B) 100 parts by weight of a vinyl compound;
wherein, the phosphorus-containing flame retardant has a structure as shown in formula (I)

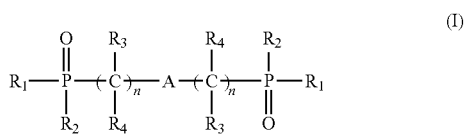

(I)

wherein, A is a covalent bond, C6~C12 arylene, C3~C12 cycloalkylene, C6~C12 cycloalkenylene, methylene or C2~C12 alkylene; $R_1$ and $R_2$ are the same or different, and are each an H, alkoxy, aryloxy, alkyl, aryl or silyl, respectively; $R_3$ and $R_4$ are the same or different, and are each an H, hydroxyl, and C1~C6 alkyl, respectively, or one and only one of $R_3$ and $R_4$ forms a carbonyl with a C; each of n is a positive integer of 1~6 independently, wherein the vinyl compound is a vinyl polyphenylene ether resin having a structure as shown below in formula (XVI)

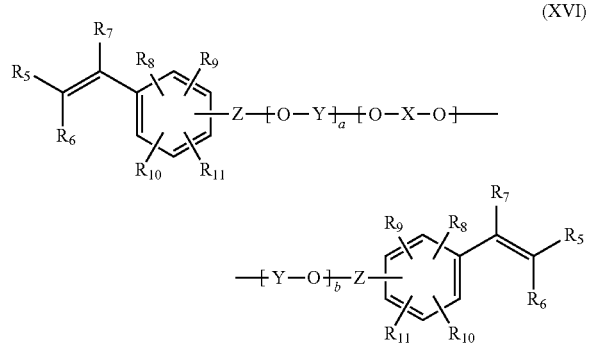

(XVI)

wherein, —(O—X—O)— refers to

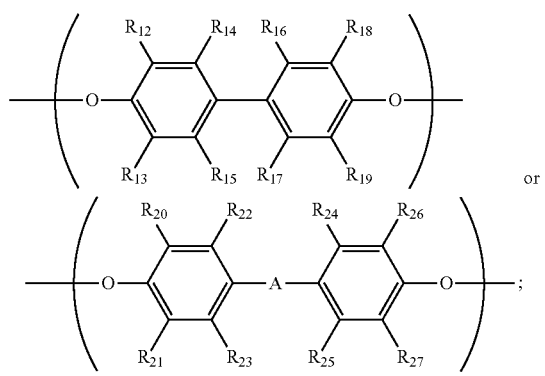

—(Y—O)— refers to

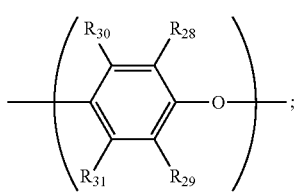

$R_5$ and $R_6$ are each a hydrogen atom, $R_7$, $R_8$, $R_9$, $R_{10}$ and $R_{11}$ are the same or different, and are each a hydrogen atom, halogen atom, alkyl, or halogen-substituted alkyl;

$R_{12}$, $R_{13}$, $R_{18}$ and $R_{19}$ are the same or different, and are each a halogen atom, C1-C6 alkyl or phenyl;

$R_{14}$, $R_{15}$, $R_{16}$ and $R_{17}$ are the same or different, and are each a hydrogen atom, halogen atom, C1-C6 alkyl or phenyl;

$R_{20}$, $R_{21}$, $R_{22}$, $R_{23}$, $R_{24}$, $R_{25}$, $R_{26}$ and $R_{27}$ are the same or different, and are each a halogen atom, C1-C6 alkyl, phenyl or hydrogen atom; A is a C1-C20 linear, branched, or cyclic alkylene;

$R_{28}$ and $R_{29}$ are the same or different, and are each a halogen atom, C1-C6 alkyl or phenyl;

$R_{30}$ and $R_{31}$ are the same or different, and are each a hydrogen atom, halogen atom, C1~C6 alkyl or phenyl;

Z represents an organic group having at least one carbon atom; and a and b are each a natural number of 1~30, respectively.

11. A printed circuit board obtained from a laminate, the laminate made from a low dielectric composite material, the low dielectric material made from a low dielectric resin composition with a phosphorus-containing flame retardant and a substrate, the low dielectric resin composition with phosphorus-containing flame retardant comprises the following components:

(A) 25 to 90 parts by weight of a phosphorus-containing flame retardant; and (B) 100 parts by weight of a vinyl compound;

wherein, the phosphorus-containing flame retardant has a structure as shown in formula (I)

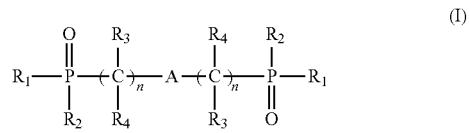

(I)

wherein, A is a covalent bond, C6~C12 arylene, C3~C12 cycloalkylene, C6~C12 cycloalkenylene, methylene or C2~C12 alkylene; $R_1$ and $R_2$ are the same or different, and are each an H, alkoxy, aryloxy, alkyl, aryl or silyl, respectively; $R_3$ and $R_4$ are the same or different, and are each an H, hydroxyl, and C1~C6 alkyl, respectively, or one and only one of $R_3$ and $R_4$ forms a carbonyl with a C; each of n is a positive integer of 1~6 independently, wherein the vinyl compound is a vinyl polyphenylene ether resin having a structure as shown below in formula (XVI)

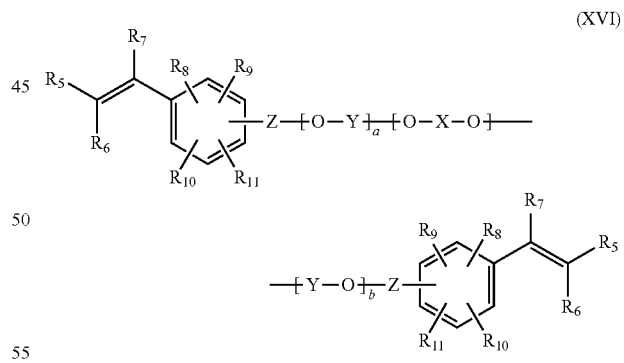

(XVI)

wherein, —(O—X—O)— refers to

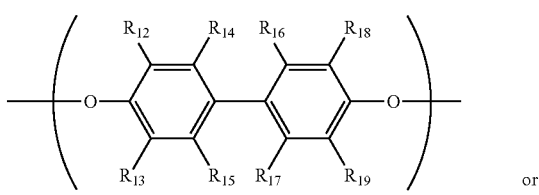

or

-continued

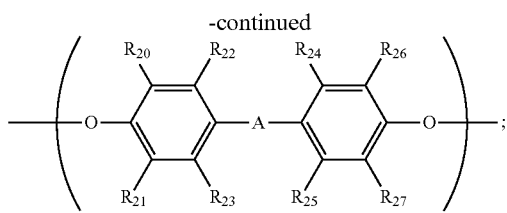

—(Y—O)— refers to

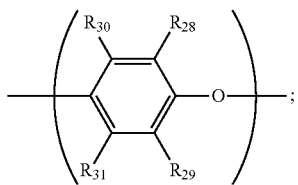

$R_5$ and $R_6$ are each a hydrogen atom, $R_7$, $R_8$, $R_9$, $R_{10}$ and $R_{11}$ are the same or different, and are each a hydrogen atom, halogen atom, alkyl, or halogen-substituted alkyl;

$R_{12}$, $R_{13}$, $R_{18}$ and $R_{19}$ are the same or different, and are each a halogen atom, C1-C6 alkyl or phenyl;

$R_{14}$, $R_{15}$, $R_{16}$ and $R_{17}$ are the same or different, and are each a hydrogen atom, halogen atom, C1-C6 alkyl or phenyl;

$R_{20}$, $R_{21}$, $R_{22}$, $R_{23}$, $R_{24}$, $R_{25}$, $R_{26}$ and $R_{27}$ are the same or different, and are each a halogen atom, C1-C6 alkyl, phenyl or hydrogen atom; A is a C1-C20 linear, branched, or cyclic alkylene;

$R_{28}$ and $R_{29}$ are the same or different, and are each a halogen atom, C1-C6 alkyl or phenyl;

$R_{30}$ and $R_{31}$ are the same or different, and are each a hydrogen atom, halogen atom, C1~C6 alkyl or phenyl;

Z represents an organic group having at least one carbon atom; and a and b are each a natural number of 1~30, respectively.

* * * * *